United States Patent [19]
Robinson

[11] Patent Number: 5,148,116
[45] Date of Patent: Sep. 15, 1992

[54] ENHANCED VACUUM TUBE POWER AMPLIFIER

[76] Inventor: John M. Robinson, 27731 Jayseel St., Tujunga, Calif. 91042

[21] Appl. No.: 754,714

[22] Filed: Sep. 4, 1991

[51] Int. Cl.$^5$ ............................................. H03F 5/00
[52] U.S. Cl. ...................................... 330/3; 330/268
[58] Field of Search ............... 330/3, 268, 298, 207 P, 330/290

[56] References Cited

U.S. PATENT DOCUMENTS

| | | | |
|---|---|---|---|
| 2,773,136 | 12/1956 | Futterman | 330/70 |
| 2,979,664 | 4/1961 | Palmer et al. | 330/3 |
| 3,253,225 | 5/1966 | Dalton et al. | 330/3 |
| 3,325,742 | 6/1967 | Moriyasu | 330/3 |
| 3,995,226 | 11/1976 | Berning | 330/3 |
| 4,163,198 | 7/1979 | Berning | 330/3 |

OTHER PUBLICATIONS

G. W. Short 1961.
Hewlett-Packard (letter by A. E. T. Nye 1961).
B. Alvsten & L. Bergsten 1968.
Mortensen 1989.

Primary Examiner—Eugene R. LaRoche
Assistant Examiner—Tan Dinh

[57] ABSTRACT

An audio power amplifier for general audio and sound reinforcement use, or musical amplification, stringed or otherwise, which combines the sonic properties of vacuum tube amplification with the modern technology of solid state electronics, with its attendant advantages.

1 Claim, 3 Drawing Sheets

ENHANCED VACUUM TUBE POWER AMPLIFIER

BACKGROUND OF THE INVENTION

1. Field of the Invention

The invention relates generally to an improved audio power amplifier, of use wherever said power amplifier is used to drive loudspeaker(s), and, more paritcularly, but not by way of limitation, where said power amplifier shall be used to amplify the output of stringed, or other, musical instruments.

2. Description of the Prior Art

The use of vacuum tubes in audio power amplifiers is quite old and well-known. Indeed, all amplifiers prior to the advent of solid-state amplifiers in the late 1950's were constructed using hard vacuum tube technology. Similarly, the use of bi-polar transistors is quite common today in audio electronics. However, applicant does not know, or has been unable to discover any teachings that would combine the two approaches, i.e., the use of bi-polar power transistors in conjunction with vacuum tube amplifier design for music audio reproduction.

SUMMARY OF THE INVENTION

The present invention relates to improvements in vacuum tube power amplifier efficiency, cost, and fidelity, by using bi-polar power in combination therewith. A vacuum tube voltage amplifier provides drive at full output level to a dual buffer array which provides base drive to an output current amplifier comprised of bi-polar power transistors. Bias control, overcurrent protection, and offset voltage control are also incorporated in the buffer circuitry.

Therefore, it is an object of the present invention to provide a power amplifier for providing the desirable sonic qualities of a vacuum tube amplifier, with the lower cost and higher efficiency of a solid state unit.

It is also an object of the present invention to lower the weight of portable "Combo" amplifiers commonly used by traveling musicians.

It is also an object of the present invention to increase the reliability and lower maintenance cost associated with vacuum tube power amplifiers.

Other objects and advantages of the invention will be evident from the following detailed description when read in conjunction with the accompanying drawings which illustrate the invention.

DETAILED DESCRIPTION OF THE INVENTION

Figure 1:
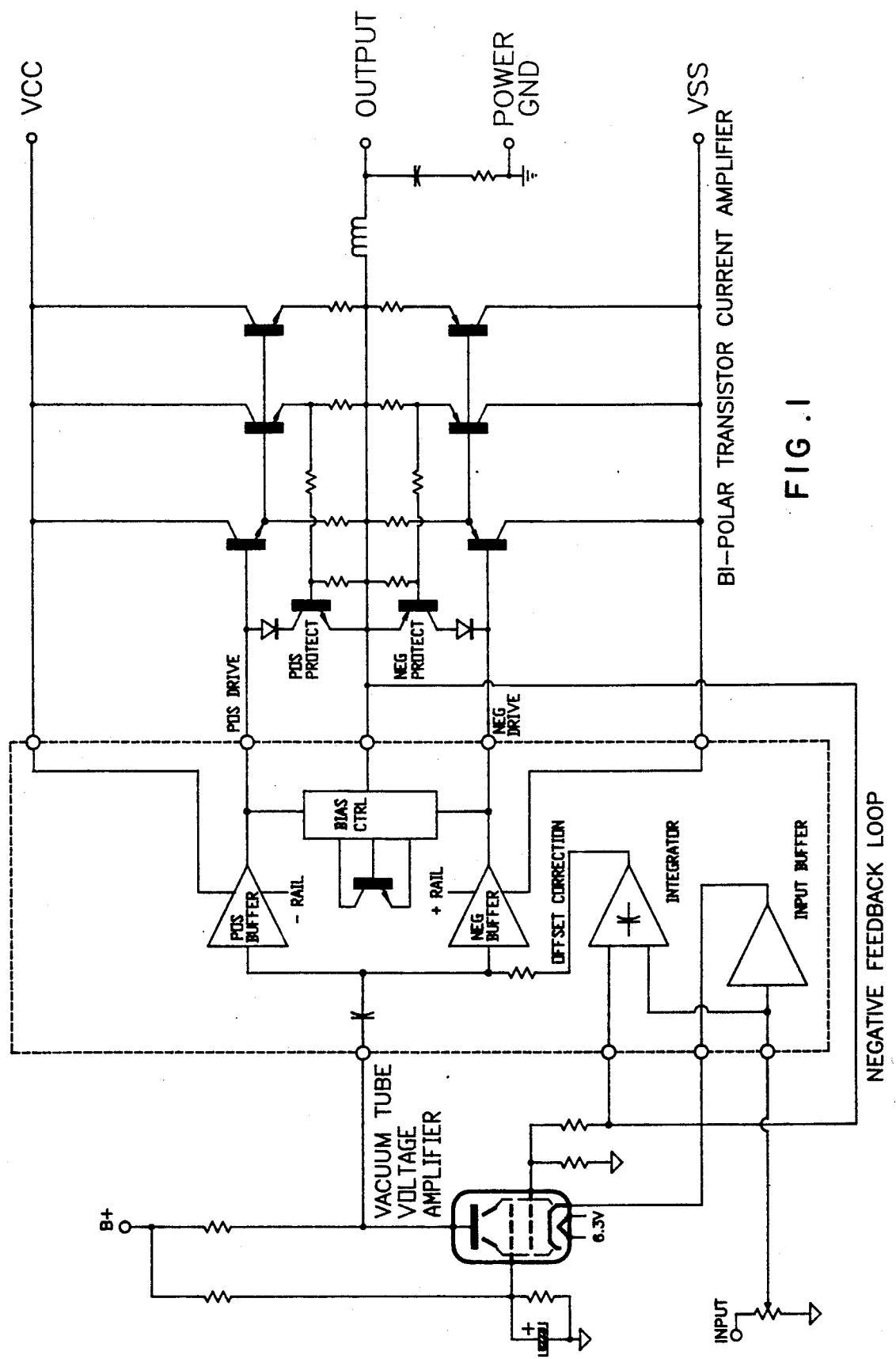
FIG. 1 is a block diagram of the amplifier showing the functional circuit blocks.
Figure 2:
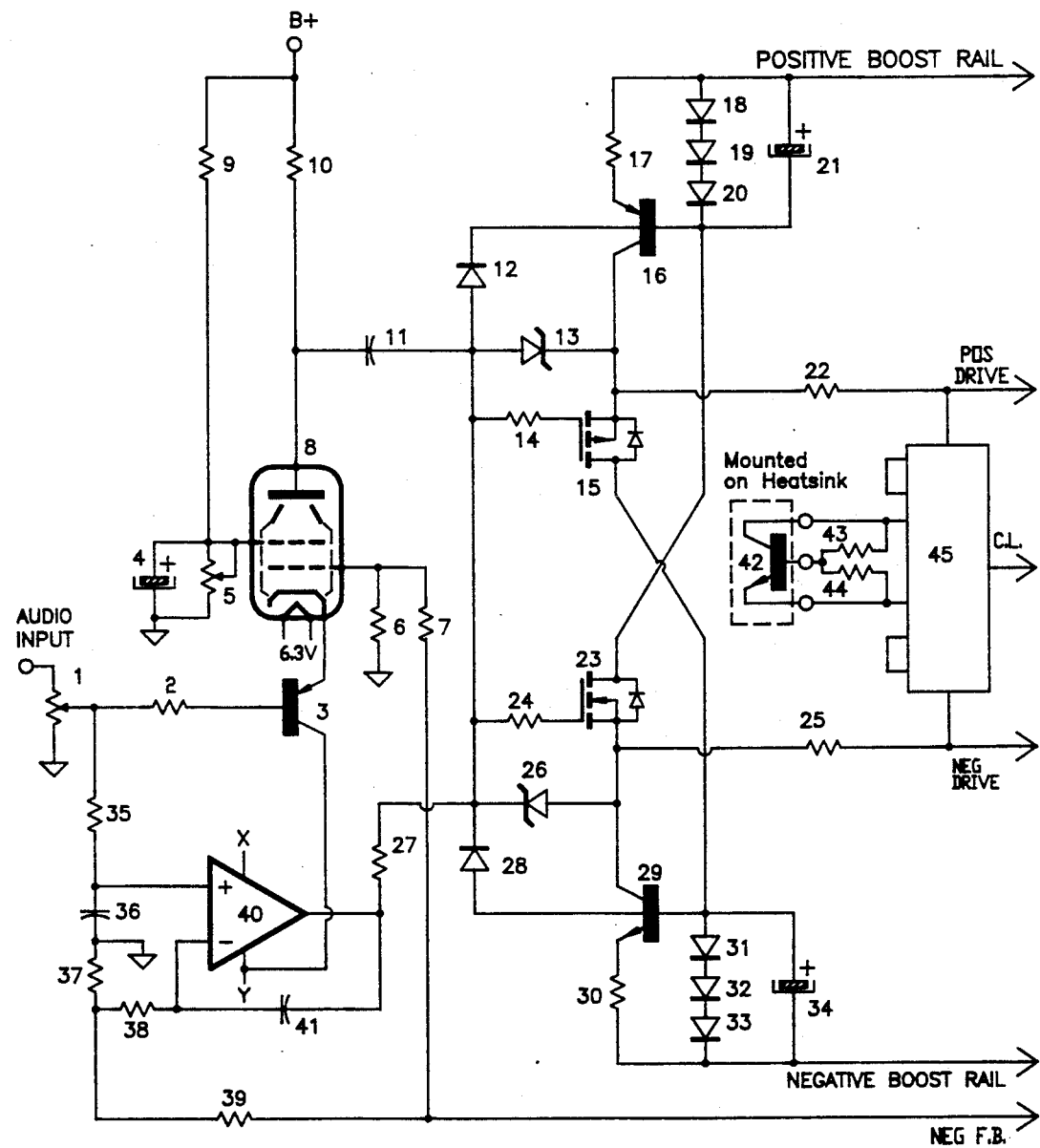
FIG. 2 is a schematic of the input stage, voltage amplifier, dual buffers, offset servo amp, and bias control circuitry.
Figure 3:
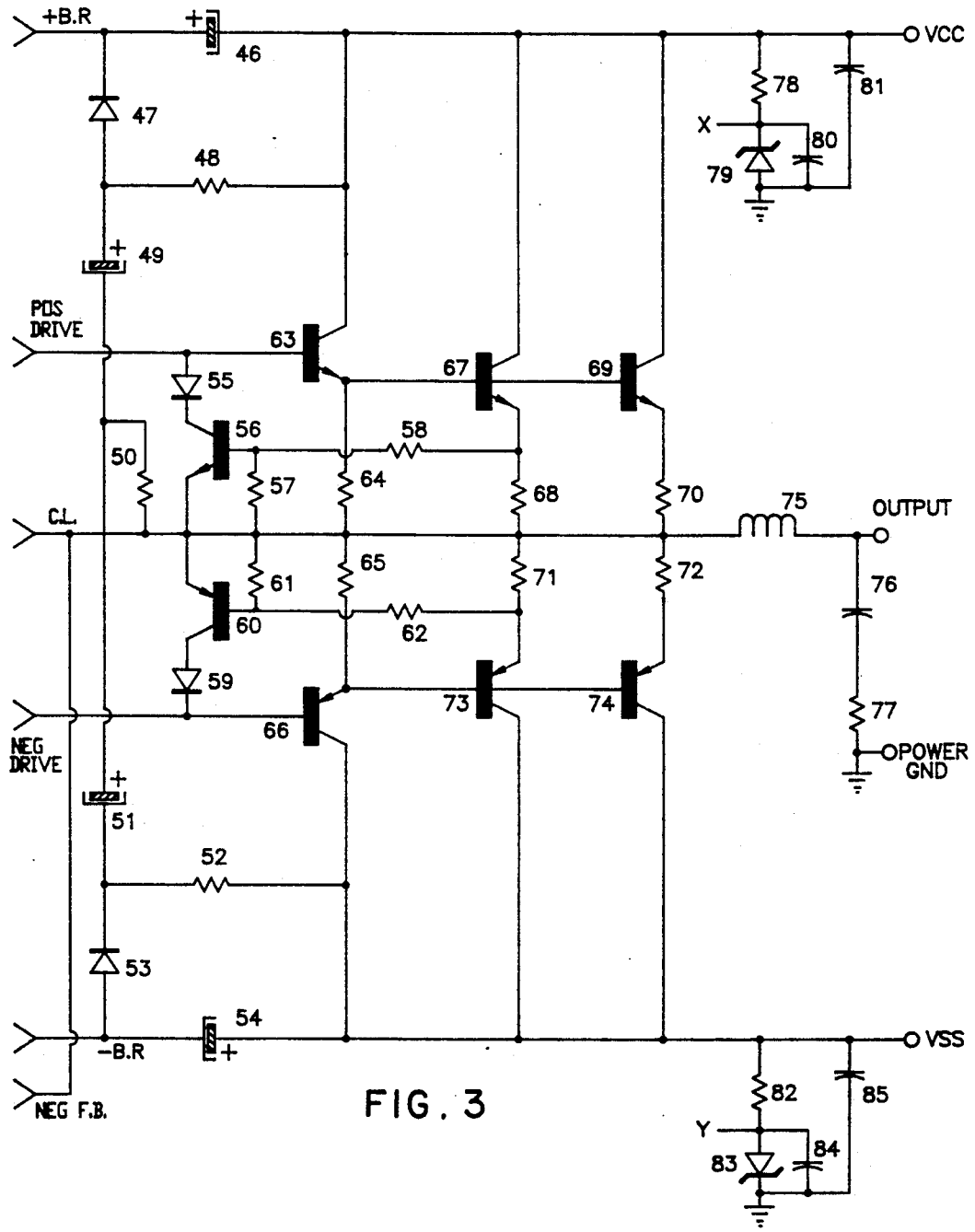
FIG. 3 is a schematic of the output stage and overcurrent control circuitry.

Referring to FIG. 2, the audio signal to be amplified is inputted to potentiometer 1 for output level control. It is then taken from the wiper of 1 and applied thru resistor 2 to PNP transistor 3, and simultaneously, thru resistor 35, to the non-inverting input of offset servo amplifier 40, type TL0723A. PNP transistor 3, as an emitter follower, serves as a buffer to match the input impedance of the cathode of vacuum tube 8, thusly providing a non-inverting high impedance input to the voltage amplifier stage comprised of beam pentode tube 8, type 6BQ5/EL85, resistors 9 and 10, potentiometer 5, and capacitor 4. Potentiometer 5 serves to adjust screen grid voltage, to achieve lowest harmonic distortion. Negative feedback voltage from the amplifier's output stage is applied to the control grid (inverting input) of vacuum tube 8, thru a voltage divider comprised of resistors 6 and 7, the ratio of which sets the AC voltage gain of the entire amplifier.

The AC signal, at full output voltage, is taken from the plate of vacuum tube 8, thru DC blocking capacitor 11, to the input of complimentary mosfet buffers 156 and 23, thru resistors 14 and 24, which serve as oscillation suppressors, Zener diodes 13 and 26 clamp the gate-to-source junctions of mosfets 15 and 23, protecting them from excessive voltage swings, while diodes 12 and 28 serve as clamps to prevent excessive reverse base-emitter junction voltage on current source transistors 16 and 29.

Mosfet buffer 15, in source follower configuration, is pulled up in the positive direction, by a current source comprised of PNP transistor 16, resistor 17, diodes 18, 19, 20 and capacitor 21. Mosfet 15's drain is returned to the NEGATIVE BOOST RAIL thru diodes 31, 32, and 33.

Similarly, mosfet buffer 23 is pulled down in the negative direction by the current source comprised of NPN transistor 29, diodes 31, 32, and 33, and capacitor 34, while mosfet 23's drain is returned to the POSITIVE BOOST RAIL thru the current source voltage reference diodes 18, 19, and 20.

Drive current from the positive buffer 15 is applied to the bias integrated circuit 45, type LA2500, thru resistor 22, becoming the signal "POS DRIVE".

Similarly, drive current from mosfet buffer 23 is applied to 45 thru resistor 25, becoming signal "NEG DRIVE".

Referring still to FIG. 2, the center line, or output buss of the amplifier is supplied to bias IC 45 for a reference point, while NPN transistor 42, whose bias is supplied by resistors 43 and 44, and is mounted on the heatsink in close proximity to the output transistors, provides thermal feedback to bias IC 45, thusly preventing thermal runaway in the output stage.

The offset servo amplifier, comprised of operational amplifier 40, resistors 35 and 38, and capacitors 36 and 41, in an integrator configuration, supplies the positive and negative buffers 15 and 23, with an offset correction, or DC error signal thru resistor 27. This signal is derived from the input signal, thru resistor 35, and the amplifier output signal, thru resistor divider 38 and 39, whose ratio also sets the stages DC gain. This provides compensation for unequal gate-source voltages in mosfet buffers 15 and 23, as well as similar disparities in transistors 63, 66, 67, 69, 73, and 74 and holds the output near to zero volts with no signal input.

Resistor 50 and capacitors 4 and 51 form a bootstrap network which applies a portion of the amplifier's output signal to diodes 47 and 53, which charge up capacitors 46 and 54 when signal is present. When signal is not present, voltage is supplied thru resistors 48 and 52. This provides the POSITIVE BOOST RAIL and the NEGATIVE BOOST RAIL voltages. This ensures adequate drive voltage swing to obtain maximum output and efficiency from the output stage.

The drive stage, comprised of NPN transistor 63, and PNP transistor 66, as well as resistors 64 and 65, further lowers the impedance of the positive and negative drive signals before application to the output stage.

The output stage, comprised of NPN power transistors 67 and 69, PNP power transistors 73 and 74, and resistors 68, 70, 71, and 72, is an emitter follower configuration, and is commonly used in most solid state amplifiers.

Overcurrent protection is provided by the voltage across resistors 68 and 71 being applied to clamp transistors 56 and 60, thru resistor dividers 58 and 57, and 62 and 61. This clamping action is applied to the positive and negative drive signals thru diodes 55 and 59, which prevent total cutoff of driver transistors 63 and 66.

The amplifier's output is taken from the center line (c.l.) thru a lo-pass filter comprised of inductor 75, capacitor 76, and resistor 77. This filter lowers distortion at higher frequencies, as well as aiding stability with reactive loads. Its inclusion is conventional with solid state output stages.

Zener diode 79, resistor 78, and capacitor 80, form a stabilized source of +15 volts at point X, and supplies op-amp 50. Similarly, zener diode 83, resistor 82, and capacitor 84 supply −15 volts to op-amp 40, and collector current for PNP transistor 3 at point Y.

Capacitors 81 and 85 serve to suppress high frequency oscillations on the power supply busses.

The foregoing discloses a unique power amplifier design which melds the latterday solid state electronics with its superb efficiency, reliability, and lower cost, with the tried and true hard vacuum tube electronics, which in many cases has been found superior to that offered by solid state electronics. In particular, it has bene found that the tonal characteristics of vacuum tube pre- and power amplifiers are often very desirable to those offered by solid state forms of a similar circuit. Therefore, the combination of the tonal characteristics of hard tube circuitry with the power and reliability of solid state, and particularly by inclusion of the vacuum tube voltage amp stage within the overall negative feedback loop, produce an amplifier which provides the best characteristics of both approaches at a reasonable cost.

Changes may be made in combination and arrangement of elements as heretofore set forth in the specification and shown in the drawings; it is being understood that changes may be made in the embodiments disclosed without departing from the spirit and scope of the invention as defined in the following claims.

What is claimed is:

1. An improved audio power amplifier comprising: an audio input:
   A. A level control and an input buffer receiving said audio input and applying it to a vacuum tube voltage amplifier producing a signal equal in amplitude to the output signal;
   B. A dual complimentary buffer array which receives the voltage amplifier signal and produces the POS DRIVE and NEG DRIVE signals at the same amplitude but at a lower impedance level;
   C. A driver stage which again lowers the impedance of the above signals;
   D. A bi-polar power transistor output stage which supplies the actual current to the loudspeaker load;
   E. An offset servo stage which serves to compensate for inequalities within the amplifier circuitry, while preserving the average D.C. level of the input;
   F. A bias control stage to control thermal runaway, and to afford the benefits of Class B operation in the input stage while lowering crossover distortion to an acceptable level;
   G. Positive side and negative side overcurrent protection circuitry to protect against an output short condition.

* * * * *